United States Patent [19]
Morishima

[11] Patent Number: 5,291,033
[45] Date of Patent: Mar. 1, 1994

[54] SEMICONDUCTOR LIGHT-EMITTING DEVICE HAVING SUBSTANTIALLY PLANAR SURFACES

[75] Inventor: Mitsukata Morishima, Yokohama, Japan

[73] Assignee: Eastman Kodak Company, Rochester, N.Y.

[21] Appl. No.: 855,828

[22] Filed: Mar. 23, 1992

[30] Foreign Application Priority Data

May 29, 1991 [JP] Japan .................. 3-125738

[51] Int. Cl.⁵ .................................. H01L 33/00
[52] U.S. Cl. ............................. 257/13; 257/95; 257/96; 257/627; 372/45; 372/46
[58] Field of Search ............. 257/95, 13, 14, 94, 257/96, 627; 372/45, 46

[56] References Cited

U.S. PATENT DOCUMENTS

| | | | |
|---|---|---|---|
| 4,599,787 | 7/1986 | Sasatani | 372/46 |
| 4,779,281 | 10/1988 | Naka et al. | 372/46 |
| 4,841,536 | 6/1989 | Ohishi et al. | 372/46 |
| 4,852,111 | 7/1989 | Hayakawa et al. | 372/46 |
| 4,926,432 | 5/1990 | Hattori | 372/46 |
| 4,937,836 | 6/1990 | Yamamoto et al. | 372/46 |
| 5,054,031 | 10/1991 | Hosoba et al. | 372/46 |

FOREIGN PATENT DOCUMENTS

| | | | |
|---|---|---|---|
| 60-14487 | 1/1985 | Japan | 372/45 |
| 61-18189 | 1/1986 | Japan | 372/50 |
| 4-72785 | 3/1992 | Japan | 372/45 |
| 4-115588 | 4/1992 | Japan | 372/46 |
| 4-120788 | 4/1992 | Japan | 372/45 |

Primary Examiner—Rolf Hille
Assistant Examiner—Minhloan Tran
Attorney, Agent, or Firm—Raymond L. Owens

[57] ABSTRACT

A semiconductor light-emitting device is disclosed in which the lifetime of the device is increased by preventing deterioration of a current blocking layer interface caused by contamination during fabrication. The light-emitting device includes a substrate having a first surface and a stepped surface extending at an angle from the first surface formed by etching through the substrate. One of the surfaces is a (100) oriented surface and the other surface is a (111)B oriented surface. A current blocking layer is deposited by molecular beam epitaxy on the (100) oriented surface and the active layers of the device are deposited on the (111)B oriented surface. The (111)B oriented surface thereby becomes the current flow channel where oscillation occurs to generate light.

17 Claims, 2 Drawing Sheets

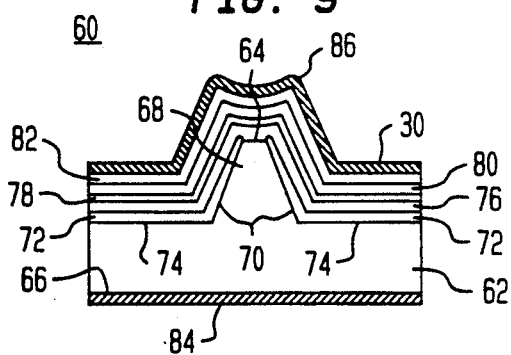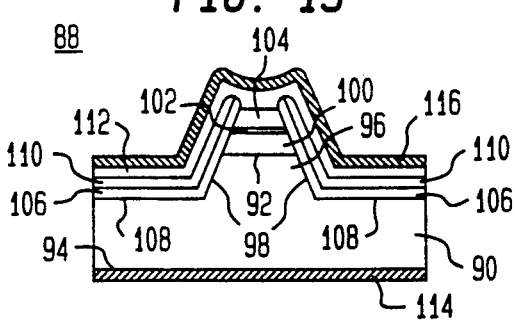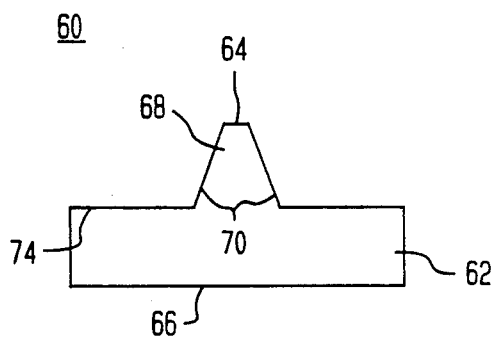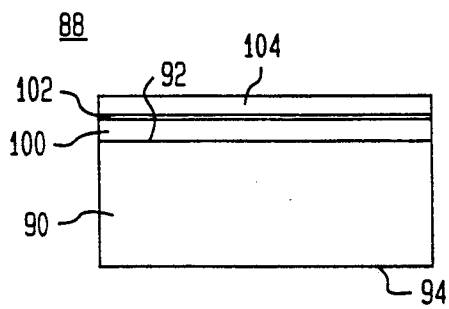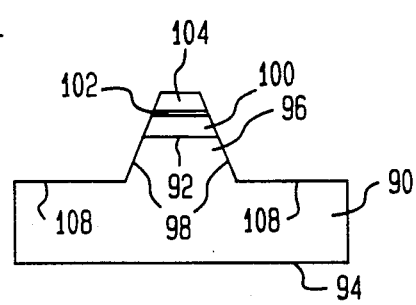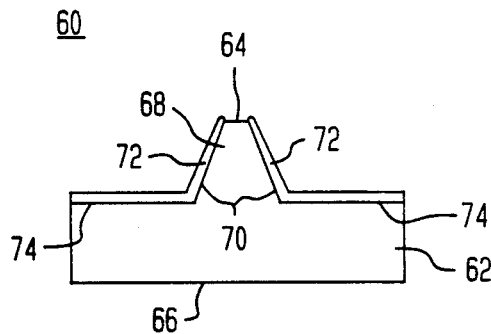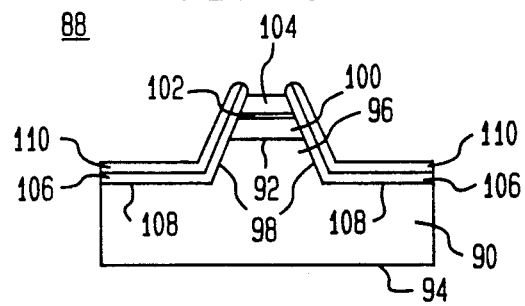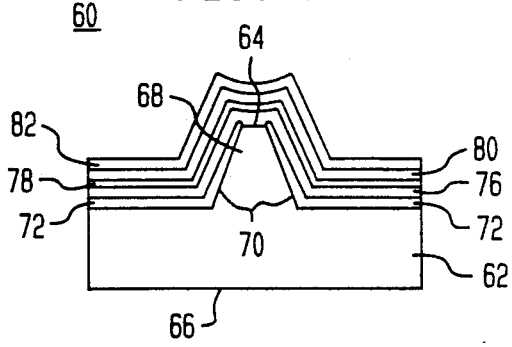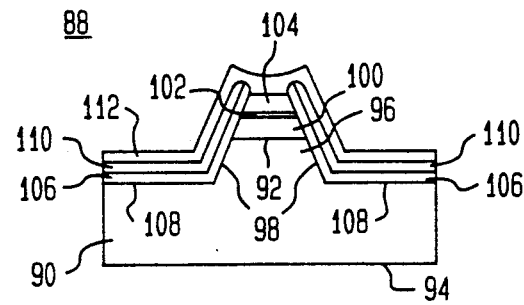

SEMICONDUCTOR LIGHT-EMITTING DEVICE HAVING SUBSTANTIALLY PLANAR SURFACES

FIELD OF THE INVENTION

The present invention relates to a semiconductor light-emitting device and method of making the same, and, more particularly, to a semiconductor laser or light-emitting diode (LED) with an improved current blocking layer and method of making the same.

BACKGROUND OF THE INVENTION

Referring now to FIG. 1, there is shown a cross-sectional view of a conventional (prior art) semiconductor laser 10. Semiconductor laser 10 comprises a substrate 12 of n-type conductivity GaAs having a pair of opposed surfaces 14 and 16. On the surface 14 is a current blocking layer 18 of p-type conductivity GaAs having a central opening 20 therethrough. The current blocking layer is about 1 micrometer in thickness and is doped with beryllium of a concentration of $1 \times 10^{18}$ impurities/$cm^3$. On the current blocking layer 18 and within the opening 20 is an n-type conductivity cladding layer 22 of $Al_{0.7}Ga_{0.3}As$. The cladding layer 22 is about 2 micrometers in thickness and is doped with silicon to a concentration of $1 \times 10^{18}$ impurities/$cm^3$. On the cladding layer 22 is an active layer 24 of n-type conductivity GaAs which is 0.1 micrometer in thickness and is doped with $5 \times 10^{17}$ impurities/$cm^3$ of beryllium. On the active layer 24 is a cladding layer 26 of p-type conductivity $Al_{0.7}Ga_{0.3}As$ of a thickness of 2 micrometers and doped with $1 \times 10^{18}$ impurities/$cm^3$ of beryllium followed by a cap layer 28 of p-type conductivity GaAs of a thickness of 2 micrometers and doped with $5 \times 10^{17}$ impurities/$cm^3$ of beryllium. A negative electrode 30 of AuZn is on the surface 16 of the substrate 12 and a positive electrode 32 of AuGe/Ni is on the cap layer 28.

Referring now to FIGS. 2, 3 and 4, there are shown sectional views illustrating a known (prior art) method of making the semiconductor laser 10. As shown in FIG. 2, the current blocking layer 18 is first epitaxially depositing using molecular beam epitaxy (MBE) on the surface 14 of the substrate 12. Then, as is shown in FIG. 3, the opening 20 is formed in the current blocking layer 18 by etching away specific portions of the current blocking layer 18. As shown in FIG. 4, cladding layer 22, active layer 24, cladding layer 26 and cap layer 28 are then deposited in succession using molecular beam epitaxy. This is followed by the deposition and alloying of the negative electrode 30 and the positive electrode 32.

In the operation of the semiconductor laser 10, the application of a reverse bias to the current blocking layer 18 and the cladding layer 22 prevents current from flowing through the current blocking layer to the substrate 12. The current only flows through the portion of the cladding layer 22 which is in the opening 20. Thus, the opening 20 serves as a current channel with an oscillation region being limited to the current channel provided by the opening 20.

A drawback with this conventional semiconductor laser 10 results from the fact that wet or dry etching of the current blocking layer 18 is required to form the current channel. To carry out the etching step, it is necessary to remove the substrate 12 from a vacuum chamber in which the semiconductor layers are grown. This gives rise to contamination caused by oxidation of the current blocking layer interface or the adhesion of impurities to the resist used to masking the current blocking layer 18 for etching the opening 20. This degradation of the current blocking layer interface shortens the life of the device.

SUMMARY OF THE INVENTION

The present invention is directed to a semiconductor light-emitting device and method of making the same in which deterioration of the current blocking layer interface is suppressed by preventing interface contamination taking place during the formation of the current blocking layer. This is achieved by a semiconductor light-emitting device comprising a substrate of a semiconductor material of one conductivity type having a first surface and a stepped surface extending at an angle from the first surface. One of the surfaces is a (100) oriented surface and the other surface is a (111)B oriented surface. A current blocking layer of a semiconductor material of the opposite conductivity type is on the (111)B oriented surface and an active layer of a semiconductor material of the opposite conductivity type is over the (100) oriented surface.

The semiconductor light-emitting device is made by forming in a substrate of a semiconductor material of one conductivity type having a first surface a stepped surface extending at an angle from the first surface with one of the surfaces being a (100) oriented surface and the other surface being a (111)B oriented surface. A current blocking layer of a semiconductor material of the opposite conductivity type is formed on the (111)B surface and an active layer of a semiconductor material of the opposite conductivity type is formed on the (100) oriented surface.

Further features of the invention, its nature and various advantages will become more apparent from the following detailed description, drawings and claims.

BRIEF DESCRIPTION OF THE DRAWINGS

FIG. 9 shows a sectional view of another semiconductor laser in accordance with the present invention;

FIGS. 10, 11 and 12 show sectional views illustrating steps of the method of making the semiconductor laser shown in FIG. 9 in accordance with another method of the present invention;

FIG. 13 shows a sectional view of still another semiconductor laser in accordance with the present invention; and FIGS. 14, 15, 16 and 17 show sectional view illustrating steps of making the semiconductor laser shown in FIG. 13 in accordance with another method of the present invention.

The drawings are not necessarily to scale.

DETAILED DESCRIPTION

Figure 1:
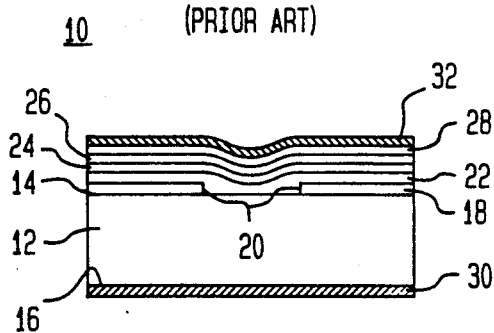
FIG. 1 shows a sectional view of a conventional semiconductor laser of the prior art.
Figure 5:
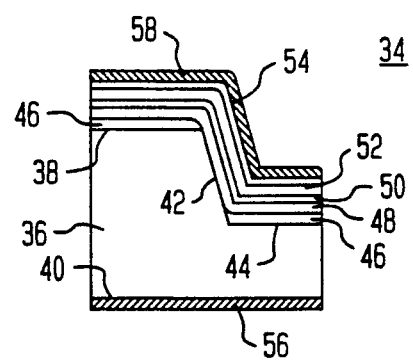
FIG. 5 shows a sectional view of a semiconductor laser in accordance with the present invention.
Figure 2:
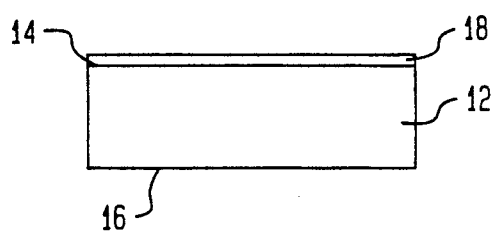
FIGS. 2, 3 and 4 show sectional views illustrating various steps of making the semiconductor laser shown in FIG. 1.

Referring now to FIG. 5, there is shown a cross-sectional view of a semiconductor laser 34 in accordance with the present invention. The semiconductor laser 34 comprises a substrate 36 of n-type conductivity GaAs having opposed surfaces 38 and 40. At least the surface 38 is a (100) surface. The substrate 36 has a stepped portion at the surface 38 with the stepped portion having a side surface 42 and a bottom surface 44. The side surface 42 is a (111)B surface (meaning the (111) face of the topmost As surface on which Ga appears). A current blocking layer 46 of p-type conductivity GaAs is on the surface 38 of the substrate 36 and the bottom surface 44 of the stepped portion. The current blocking layer 46 is about 1 micrometer in thickness and is doped with $1 \times 10^{18}$ impurities/cm$^3$ of beryllium.

A first cladding layer 48 of n-type conductivity $Al_{0.7}Ga_{0.3}As$ is on the current blocking layer 46 and the side surface 42 of the stepped portion. The first cladding layer 48 is about 2 micrometers in thickness and is doped with $1 \times 10^{18}$ impurities/cm$^3$ of silicon. A p-type conductivity active layer 50 is on the cladding layer 48. The active layer 50 is about 0.1 micrometer in thickness and is doped with $5 \times 10^{17}$ impurities/cm$^3$ of beryllium. A p-type conductivity $Al_{0.7}Ga_{0.3}As$ second cladding layer 52 is on the active layer 50. The second cladding layer 52 is about 2 micrometers in thickness and is doped with $1 \times 10^{18}$ impurities/cm$^3$ of beryllium. On the second cladding layer 52 is a cap layer 54 of p-type conductivity GaAs. The cap layer 54 is about 2 micrometers in thickness and is doped with $4 \times 10^{18}$ impurities/cm$^3$ of beryllium. A negative electrode 56 of AuGe/Ni is on the surface 40 of the substrate 36 and a positive electrode 58 of AuZn is on the cap layer 54.

Figure 6:
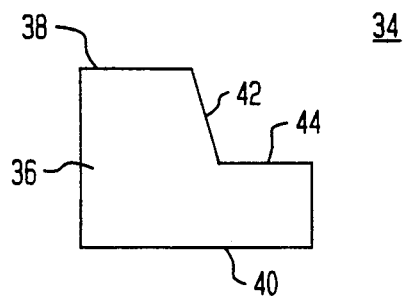
FIGS. 6, 7 and 8 show sectional views illustrating steps of making the semiconductor laser shown in FIG. 5 in accordance with a method of the present invention.
Figure 3:
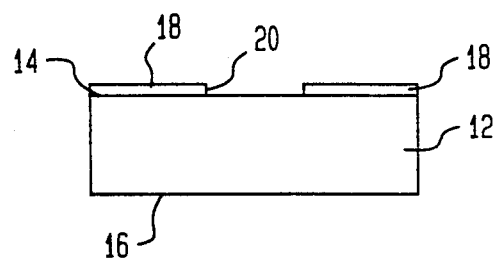
Figure 7:
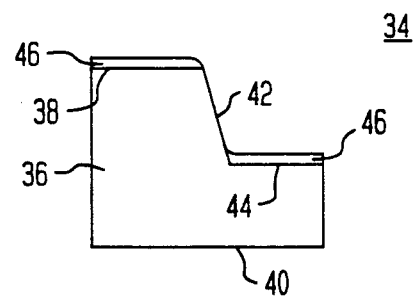
Figure 4:
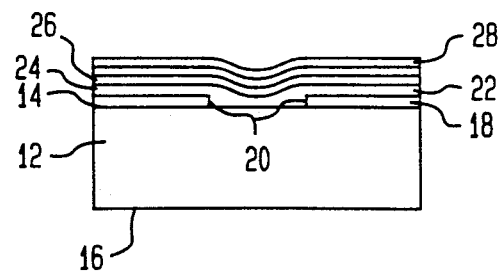
Figure 8:
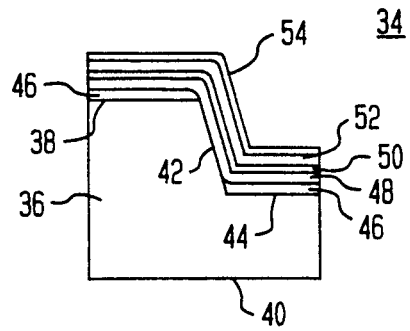

Referring to FIGS. 6, 7 and 8, there are shown cross-sectional views illustrating the steps of a method in accordance with the present invention for making the semiconductor laser 34 of FIG. 5. As shown in FIG. 6, the stepped portion of the substrate 36 is formed by wet etching using a sulfuric acid based etching agent ($H_2SO_4:H_2O_2:H_2O=1:8:600$). The wet etching is done in such a way as to control the angle of the side surface 42 and provide the stepped portion with the (111)B side surface 42. An $As_2$ beam, for example, obtained by cracking an $As_4$ beam, is then used for the deposition by MBE of the current blocking layer 46. The beam is adjusted so that the flux ratio As/Ga between Ga (group III) and As (group V) is at least 1. As shown in FIG. 7, since an As trimmer structure is used to provide stabilization, there is no growth of the GaAs on the (111)B side surface 42 and the current blocking layer 46 is deposited only on the surface 38 of the substrate 36 and the bottom surface 44 of the stepped portion, each of which is a (100) surface. An As trimmer structure formed on a GaAs (111)B surface is described in an article by D. K. Biegelslen et al., in PHYSICAL REVIEW LETTERS, Vol. 65, Pg. 452 (1990). As shown in FIG. 8, MBE with an $As_4$ beam is used to deposit on the current blocking layer 46 and the side surface 42 the first cladding layer 48 followed in succession by the active layer 50, the second cladding layer 52 and the cap layer 54. As shown in FIG. 5, the negative electrode 56 is deposited on the surface 40 of the substrate 36, and the positive electrode 58 is deposited on the cap layer 54. The electrodes 56 and 58 are alloyed.

In the operation of the semiconductor laser 34 of the present invention, the application of a prescribed driving voltage to the electrodes 56 and 58 produces a reverse bias in the current blocking layer 46 and the cladding layer 48. This prevents current flow across the current blocking layer 46 with the current flowing only across the side surface 42 of the stepped portion to achieve oscillation. Thus, the side surface 42 becomes a current channel to achieve oscillation and the generation of light. Since the side surface 42 is angled at a small angle, the current channel is therefore made narrow and ineffective use of current is thereby suppressed.

The method of the present invention for making the semiconductor laser 34 has the advantage that it is not necessary to remove the substrate 36 from the vacuum chamber when forming the current channel where there is no current blocking layer 46. The current blocking layer 46 and the current channel are formed at the same time by MBE. Thus, contamination of the current blocking layer interface is avoided.

Referring now to FIG. 9, there is shown a cross-sectional view of a semiconductor laser 60 in accordance with the present invention. The semiconductor laser 60 comprises a substrate 62 of n-type conductivity GaAs having a pair of opposed surfaces 64 and 66. At least the surface 64 is a (111)B surface. The substrate 62 has a strip-shaped mesa 68 therein along the surface 64. Stepped side surfaces 70 of the mesa 68 are (100) surfaces. The mesa is typically 2 micrometers high and 2 micrometers wide at its bottom. A current blocking layer 72 of p-type conductivity GaAs is on each of the side surfaces 70 and is on surfaces 74 of the substrate 62 which extend from each side of the mesa 68. The current blocking layer 72 is about 1 micrometer in thickness and is doped with $1 \times 10^{18}$ impurities/cm$^3$ of beryllium.

A first cladding layer 76 of n-type conductivity $Al_{0.7}Ga_{0.3}As$ is on the current blocking layer 72 and the portion of the substrate surface 64 at the top of the mesa 68. The first cladding layer 76 is about 2 micrometers in thickness and is doped with $1 \times 10^{18}$ impurities/cm$^3$ of silicon. An active layer 78 of p-type conductivity GaAs is on the first cladding layer 76. The active layer 78 is about 0.1 micrometers in thickness and is doped with $5 \times 10^{17}$ impurities/cm$^3$ of beryllium. On the active layer 78 is a second cladding layer 80 of p-type conductivity $Al_{0.7}Ga_{0.3}As$ which is about 2 micrometers in thickness and is doped with $1 \times 10^{18}$ impurities/cm$^3$ of beryllium. Finally, a p-type conductivity GaAs cap layer 82 is on the second cladding layer 80. The cap layer 82 is about 2 micrometers in thickness and is doped with $4 \times 10^{18}$ impurities/cm$^3$ of beryllium. A negative electrode 84 of AuGe/Ni is on the surface 66 of the substrate 62 and a positive electrode 86 of AuZn is on the cap layer 82.

Referring now to FIGS. 10, 11 and 12, there are shown cross-sectional views illustrating a method in accordance with the present invention for making the semiconductor laser 60 of FIG. 9. As shown in FIG. 10, wet etching using a sulfuric acid based etching agent ($H_2SO_4:H_2O_2:H_2O=1:8:600$) is used to form the mesa 68 in the substrate 62. The etching is controlled to provide the slope of the mesa so that the stepped side surfaces 70 have (100) orientation.

MBE using an $As_2$ beam obtained by cracking an $As_4$ beam, for example, is then employed to deposit the current blocking layer 72, as shown in FIG. 11. The stabilization provided by the As trimmer structure prevents growth of the p-type GaAs on the (111)B surface 64 at the top of the mesa 68 and gallium atoms impinging on the surface 64 flow down the (100) side surfaces 70 where they produce a growth formation. However, since there is no region on the (111)B surfaces 74 at the bottom of the mesa 68 to which the gallium atoms can flow, formation of GaAs takes place on the surfaces 74. Thus, as shown in FIG. 11, the current blocking layer 72 is formed on the side surfaces 70 of the mesa 68 and the surfaces 74 at the bottom of the mesa 68.

As shown in FIG. 12, MBE using an $As_4$ beam is used to deposit the first cladding layer 76 on the current blocking layer 72 and the surface 64 at the top of the mesa 68. This is followed in succession by depositing the active layer 78, the second cladding layer 80, and the cap layer 82. As shown in FIG. 9, the electrodes 84 and 86 are then deposited on the surface 66 of the substrate 62 and the cap layer 82 respectively and then alloyed.

In the operation of the semiconductor laser 60, when a reverse bias applied to the current blocking layer 72 and the cladding layer 76, current flow across the current blocking layer 72 is prevented. The current only flows across the mesa 68 through the surface 64 at the top of the mesa 68. Thus, the top surface 64 forms a current channel through which current flows to produce oscillation. Since the width of the surface 64 at the top of the mesa 68 can be controlled by the etching process, the width of the current channel can be reduced. Since the current channel can be formed without removing the substrate 62 from the vacuum growth chamber, there is no contamination of the current blocking layer interface.

Referring now to FIG. 13, there is shown a cross-sectional view of a semiconductor laser 88 in accordance with the present invention. The semiconductor laser 88 comprises a substrate 90 of n-type conductivity GaAs having a pair of opposed surfaces 92 and 94. At least the surface 92 is a (111)B oriented surface. The substrate 90 has a strip shaped mesa 96 with the surface 92 forming the top surface of the mesa 96. Stepped side surfaces 98 of the mesa 96 are (100) oriented surfaces. On the top surface 92 of the mesa 96 is a first cladding layer 100 of n-type conductivity $Al_{0.7}Ga_{0.3}As$ which is 2 micrometers in thickness and is doped with $1 \times 10^{18}$ impurities/$cm^3$ of silicon. On the first cladding layer 100 is an active layer 102 of p-type conductivity GaAs. The active layer 102 is 0.1 micrometer in thickness and is doped with $5 \times 10^{17}$ impurities/$cm^3$ of beryllium. A second cladding layer 104 of p-type conductivity $Al_{0.7}Ga_{0.3}As$ is on the active layer 102. The second cladding layer 104 is 2 micrometers in thickness and is doped with $1 \times 10^{18}$ impurities/$cm^3$ of beryllium.

A first current blocking layer 106 of p-type conductivity GaAs is over the sides of the second cladding layer 104, the active layer 102, the second cladding layer 100, the side surfaces 98 of the mesa 96 and surfaces 108 of the substrate 90 at the sides of the mesa 96. The first current blocking layer 106 is 1 micrometer in thickness and is doped with $1 \times 10^{18}$ impurities/$cm^3$ of beryllium. A second current blocking layer 110 of n-type conductivity GaAs is over the first current blocking layer 106. The second current blocking layer 110 is 1 micrometer in thickness and is doped with $1 \times 10^{18}$ impurities/$cm^3$ of silicon. A cap layer 112 of p-type conductivity GaAs is over the second cladding layer 104 and the second current blocking layer 110. The cap layer 112 is 2 micrometers in thickness and is doped with $4 \times 10^{18}$ impurities/$cm^3$ of beryllium. A negative electrode 114 of AuGe/Ni is on the surface 94 of the substrate 90 and a positive electrode 116 of AuZn is on the cap layer 112.

Referring now to FIGS. 14, 15, 16 and 17, there are shown cross-sectional views illustrating the various steps of the method of the present invention for making the semiconductor laser 88 shown in FIG. 13. As shown in FIG. 14, MBE is used to deposit on the (111)B surface 92 of the substrate 90 in succession the first cladding layer 100, the active layer 102, and the second cladding layer 104. As shown in FIG. 15, a wet etching using a sulfuric acid based etching agent ($H_2SO_4$:$H_2O_2$:$H_2O$ = 1:8:600) is used to etch through the second cladding layer 104, active layer 102, first cladding layer 100 and a portion of the substrate 90 to form the mesa 96. The total height of the mesa 96 is preferably 7 micrometers and the width at its top is 2 micrometers. This etching is controlled to provide the stepped side surfaces 98 of the mesa 96 with the (100) orientation.

As shown in FIG. 16, an $As_2$ beam, for example, obtained by cracking an $As_4$ beam, is then used for the MBE deposition of the first current blocking layer 106 and the second blocking layer 110. The stabilization provided by the As trimmer structure suppresses growth of both p-type GaAs and n-type GaAs on a (111)B oriented surface. Thus gallium atoms impinging on the cladding layer 104 on the mesa 96 flow down to the (100) oriented side surfaces 98 of the mesa 96 where they produce a growth formation. However, there is no region on the (111)B oriented surfaces 108 to which the gallium atoms can so that formation of GaAs takes place on the surfaces 108 as well as the side surfaces 98. This forms the first and second current blocking layers 106 and 110. MBE is then used to deposit the cap layer 112. The electrodes 114 and 116 are then deposited and alloyed.

In the operation of the semiconductor laser 88, when a reverse bias is applied to the laser 88, current does not flow across the current blocking layers 106 and 110. Current only flows through the mesa 96 which serves as the current flow channel where oscillation takes place to generate light. Since the mesa 96 is formed by an etching process its width can be controlled to permit the forming of a reduced width current flow channel and thereby suppress ineffective use of current.

It is to be appreciated and understood that the specific embodiments of the invention are merely illustrative of the general principles of the invention. Various modifications may be made consistent with the principles set forth. For example, the substrates of the various semiconductor lasers have been described as being of n-type conductivity, they can be of p-type conductivity and suitably changing the conductivity type of the various layers of the laser. Still further, instead of using AlGaAs for certain of the layers, other materials, such as InAlGaP or InGaAsP can be used.

What is claimed is:

1. A semiconductor light-emitting device having substantially planar surfaces, comprising:
   a substrate of a crystalline semiconductor material of a first conductivity type having a back surface and first and second front surfaces and at least one stepped front surface extending at an angle between said first and second front surfaces;
   at least one current blocking layer of a semiconductor material of a second conductivity type extending over each of the front surfaces except such front surfaces having a (111)B crystalline orientation;
   a first cladding layer of a semiconductor material of the first conductivity type extending at least across front surfaces having said (111)B crystalline orientation;

an active layer of a semiconductor material of the second conductivity type extending at least across front surfaces having said (111)B crystalline orientation;

a second cladding layer of a semiconductor material of the second conductivity type extending at least across front surfaces having said (111)B crystalline orientation;

a cap layer of a semiconductor material of the second conductivity type extending over the uppermost layer on each of the front surfaces;

a first conductive electrode layer on the cap layer;

a second conductive electrode layer on the back surface of the substrate; and the first and second electrodes being arranged so that in response to a bias voltage between them the device produces a light emission.

2. The semiconductor light-emitting device of claim 1, wherein the substrate is of n-type conductivity GaAs crystalline semiconductor material and the one current blocking layer is of p-type conductivity GaAs semiconductor material.

3. The semiconductor light-emitting device of claim 1, wherein the first front surface of the substrate has a (100) crystalline orientation and wherein the one stepped front surface has (111)B crystalline orientation.

4. The semiconductor light-emitting device of claim 1, wherein the first front surface of the substrate has a (111)B crystalline orientation and wherein the one stepped front surface has a (100) crystalline orientation.

5. The semiconductor light-emitting device of claim 3, wherein the second front surface is spaced from the first front surface and wherein the one stepped front surface extends between the first and second front surfaces.

6. The semiconductor light-emitting device of claim 5, wherein the current blocking layer is only on the first and second front surfaces of the substrate.

7. The semiconductor light-emitting device of claim 6, further comprising:

a first cladding layer of a semiconductor material of the first conductivity type on the current blocking layer and on the one stepped front surface;

the active layer being on the first cladding layer;

a second cladding layer of a semiconductor material of the second conductivity type on the active layer; and a cap layer of a semiconductor material of the second conductivity type on the second cladding layer.

8. The semiconductor light-emitting device of claim 4, wherein the second front surface is spaced from the first front surface and wherein the one stepped front surface extends between the first and second front surfaces.

9. The semiconductor light-emitting device of claim 8, wherein the current blocking layer is only on the second front surface and on the one stepped front surface of the substrate.

10. The semiconductor light-emitting device of claim 9, further comprising:

a first cladding layer of a semiconductor material of the first conductivity type on the current blocking layer and on the first front surface;

the active layer being on the first cladding layer;

a second cladding layer of a semiconductor material of the second conductivity type on the active layer; and a cap layer of a semiconductor material of the second conductivity type on the second cladding layer.

11. The semiconductor light-emitting device of claim 10, wherein:

the substrate has a strip-shaped mesa region of trapezoidal cross-section with first and second stepped front surfaces extending at an angle from the first front surface;

the first and second stepped front surfaces have (100) crystalline orientation; and a second front surface extends from each of the first and second stepped front surfaces.

12. The semiconductor light-emitting device of claim 11, wherein:

the current blocking layer is on both stepped front surfaces and on each of the second front surfaces; and the first cladding layer, active layer, second cladding layer and cap layer extend over the first front surface, both stepped front surfaces and each of the second front surfaces.

13. The semiconductor light-emitting device of claim 9, wherein the active layer is only over the first front surface and wherein the current blocking layer extends across the edge of the active layer and the one stepped front surface.

14. The semiconductor light-emitting device of claim 13, further comprising:

a first cladding layer of a semiconductor material of the first conductivity type directly on only the first front surface;

the active layer being on the first cladding layer;

a second cladding layer of a semiconductor material of the second conductivity type being on only the active layer, and the current blocking layer extending across the edge of each of the cladding layers and the active layer.

15. The semiconductor light-emitting device of claim 14, further comprising:

a second current blocking layer of a semiconductor material of the first conductivity type on the one current blocking layer of a semiconductor material of the second conductivity type; and a cap layer of a semiconductor material of the second conductivity type on the second cladding layer and on the second current blocking layer.

16. The semiconductor light-emitting device of claim 15, wherein:

the substrate has a strip-shaped mesa of trapezoidal cross-section with first and second stepped front surfaces extending at an angle from the first front surface;

the first and second stepped front surfaces have (100) crystalline orientation; and a second front surface extends from each of the first and second stepped front surfaces.

17. The semiconductor light-emitting device of claim 16, wherein the current blocking layers are on each of the first and second stepped front surfaces and on each of the second front surfaces, and the cap layer extends over the first front surface, each of the stepped front surfaces and each of the second front surfaces.

* * * * *